United States Patent

Fang et al.

[11] Patent Number: 6,072,201
[45] Date of Patent: Jun. 6, 2000

[54] HOLE-INJECTION TYPE SEPARATE ABSORPTION AND MULTIPLICATION AVALANCHE PHOTODIODE

[75] Inventors: Yeau-Kuen Fang, Tainan; Kuen-Hsien Lee, Taichung; Gun-Yuan Lee, Hou Bi Xiang, all of Taiwan

[73] Assignee: National Science Counsel, Taipei, Taiwan

[21] Appl. No.: 09/227,322

[22] Filed: Jan. 6, 1999

Related U.S. Application Data

[63] Continuation of application No. 08/662,225, Jun. 7, 1996, abandoned.

[51] Int. Cl.$^7$ ............... H01L 31/107; H01L 31/0312; H01L 29/165
[52] U.S. Cl. ............... 257/186; 257/53; 257/55; 257/438
[58] Field of Search ............... 257/186, 438, 257/53, 55

[56] References Cited

U.S. PATENT DOCUMENTS 4,212,019  7/1980  Wataze et al. ............... 257/438
5,260,560  11/1993  Yamanobe ............... 257/186

OTHER PUBLICATIONS

Hwang et al., *IEEE Trans On Elec Dev.* vol. 40 No. 4 "An a–Si:H/a–Si,Ge:H . . . Detector" pp. 721–726, Apr. 1993.
Hong et al, *IEEE Trans On Elec. Dev.* vol. 37 No. 8 "Optical . . . Photodiodes" pp. 1804–1808, Aug. 1990.

*Primary Examiner*—Jerome Jackson, Jr.
*Attorney, Agent, or Firm*—Chi Ping Chang

[57] ABSTRACT

An amorphous silicon based hole-injection type "Separate Absorption and Multiplication Avalanche Photodiode" ("SAMAPD") has been invented. The device was made by separating an absorption layer and an avalanche layer from a conventional APD (Avalanche Photodiode). This will make a majority of an voltage bias to go across on the avalanche layer (i.e., a high energy bandgap material) and to enlarge an avalanche multiplication effect (i.e., increasing optical gains). In addition, the voltage bias goes across on the absorption layer will be sufficiently small to reduce a dark current. Using an i-a-Si:H material as the avalanche layer material and an i-a-$Si_{1-x}$:$Ge_x$:H material as the absorption layer material, the hole-injection type SAMPAD yields a very high gain, i.e., 686, at a reverse bias of 16V under an incident light power of $P_{in}$=1 μw. The product of this invention is very suitable for use in a long distance optical communication.

8 Claims, 8 Drawing Sheets

ION

HOLE-INJECTION TYPE SEPARATE ABSORPTION AND MULTIPLICATION AVALANCHE PHOTODIODE

This is a continuation application of application Ser. No. 08/662,225 filed on Jun. 7, 1996, now abandoned, of FANG ET AL for A HOLE INJECTION TYPE SEPARATION ABSORPTION AND MULTIPLICATION AVALANCE PHOTODIODE.

FIELD OF THE INVENTION

This invention relates to a novel absorption and multiplication avalanche photodiode. More specifically, this invention relates to a hole-injection type separate absorption avalanche photodiode useful in a fiber optical communication.

BACKGROUND OF THE INVENTION

Fiber optical communication has became a new fashion in communication and is expected to replace conventional cables as a major communication transmission medium in the future. In a fiber optical communication system, it is necessary to have a photo detector to detect and accept light signals. An avalanche photodiode ("APD") is a well-known optical detector which plays a role in the fiber optical communication system to accept transmitted light signals.

The avalanche photodiode has been described in several literature. For instances, Capasso. F. et. al. have reported a separate absorption and multiplication avalanche photodiode in *Electron Letter*, 1984, Vol. 20, no.15, pp635–637. Ravi Kuchibhotlla et. al. described a PIN avalanche photodiode in *Journal Lightwave Technology*, 1991, Vol. 7, No. 7 pp900–905. However, most of the avalanche photodiode were made by Groups III–V, II–VI materials which present many practical problems. Notably, the preparation cost is too expensive, the materials are not easy to obtain, the preparation processes are too complicated as they involve a molecular beam epitaxy (MBE) or a liquid phase epitaxy (LPE) and the process temperature is too high. It is apparent that there is a need for an alternative APD which can be prepared by a material at a low cost and under a low temperature.

Hong et. al. in *IEEE Trans. Electron Devices*, 1990, Vol. 37, No.8, pp 1804–1809, have described an amorphous silicon material that may be suitable as an alternative for APD production because of its low material cost, low process temperature and feasibility of being made as a large area device. Hwang et. al. reported that one of the advantages of the amorphous silicon material is that it has no lattice mismatch energy gap so that the APD made with the material can be easily changed to adjust its energy level to absorb different wavelength lights. However, the amorphous silicon material is still unavailable until now. It is therefore an object of the invention to provide for a novel avalanche photodiode made from the amorphous silicon material to replace the conventional APD.

It is a further object of the invention to provide for a simple process for preparation of an avalanche photodiode made from the amorphous silicon material which can be practiced under a low temperature and at a low cost to eliminate the problems of high temperature process and high cost as required for the conventional APD preparation.

SUMMARY OF THE INVENTION

The invention relates to a hole-injection type Separate Absorption and Multiplication Avalanche Photodiode

2

("SAMAPD") made from an amorphous silicon material and a process of preparing the same. The hole-injection type SAMAPD was made by separating an absorption layer and an avalanche layer from a conventional APD. This will make most of an voltage bias to go across on the avalanche layer (i.e., a high energy bandgap material) and to enlarge an avalanche multiplication effect, i.e., increasing optical gains. In addition, the voltage bias goes across on the absorption layer is sufficiently small to limit a dark current. Using an i-a-Si:H as the avalanche layer material and an a-$Si_{1-x}$:$Ge_{-x}$:H as the absorption layer material, the hole-injection type SAMAPD yields a very high gain, i.e., 686, at a reverse bias of 16V under an incident light power of $P_{in}$=1 μw, thus the novel SAMAPD provided by this invention is very suitably applicable to a long distance optical communication.

The hole-injection SAMAPD provided by the invention comprises a substrate and an absorption layer, the absorption layer deposited on top of the substrate is made with the a-$Si_{1-x}$:$Ge_x$:H material. The hole-injection SAMAPD further comprises an avalanche layer formed by the a-Si:H material located on a upper surface of the absorption layer, an Al layer located on a upper surface of the avalanche layer, and a transparent conducting oxide layer deposited on a glass surface under thermal evaporation to form the substrate. In a preferred embodiment, a n+ type or a p+ type a-Si:H layer may be further deposited between each or some of the above described layers. In this embodiment, the absorption layer is formed by depositing the i-a-Si:H material on a surface of the n+ type a-Si:H layer. The avalanche layer is formed by depositing the i-a-Si :H layer on a surface of the n+ type a-Si:H layer. The transparent conducting oxide may be an Indium-Tin-Oxide (ITO). The X value in the general formula of a-$Si_{1-x}$:$Ge_x$:H represents the atom percentage of the Ge content in the a-$Si_{1-x}$:$Ge_x$:H material, its values ranging from 0 to 0.48, its absorbed wavelengths ranging from 525 nm to 820 nm, respectively.

DETAILED DESCRIPTION OF A PREFERRED EMBODIMENT

Figure 1:
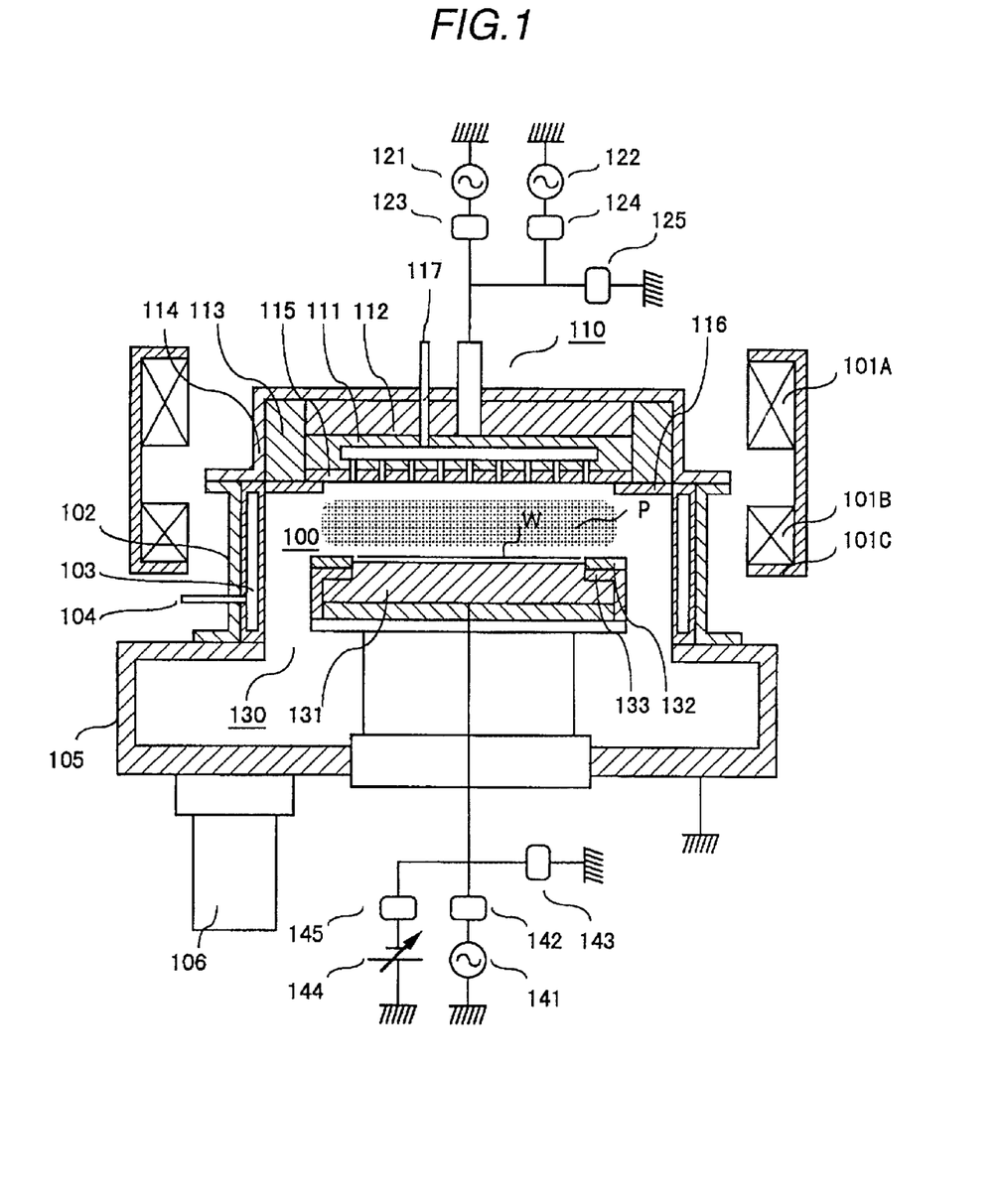
FIG. 1 illustrates a schematic cross section of a high gain amorphous SAMAPD in accordance with the invention wherein numerals 1–7 having the following designations: 1-Al; 2-p+ type a-Si:H; 3-i-a-Si:H; 4-n+ type a-Si:H; 5-i-a-$Si_{1-x}$:$Ge_{-x}$:H; 6-ITO and 7-glass plate.

Referring to FIG. 1, a schematic cross section of a hole-injection, high gain amorphous SAMAPD in accordance with the invention is illustrated in which numeral 1 is an Al, numeral 2 is a p+ type a-Si:H ("p+-a-Si:H"), numeral 3 is an i-a-Si:H, numeral 4 is a first or a second n+ type a-Si:H ("n+-a-Si:H"), numeral 5 is an i-a-$Si_{1-x}$:$Ge_x$, numeral 6 is an ITO and numeral 7 is a glass plate. The glass plate 7 is first precoated with the ITO 6 to form an ITO-precoated glass plate which was used as the substrate, then the first n+-a-Si:H layer 4, the i-a-$Si_{1-x}$:$Ge_x$:H layer 5, the second n+-a-Si:H layer 4, the i-a-Si:H layer 3 and the p+-Si-H layer 2 are deposited sequentially to the substrate in an order illustrated in FIG. 1 by using a PECVD system after the substrate is cleaned. Finally, the Al layer 1 was deposited by thermal evaporation and used as a contact electrode having an area of 1.8 $mm^2$.

A series of important parameters in connection with the preparation of the SAMAPD such as a RF (Radiant-Frequency) power, substrate temperature and total growth pressure during deposition of the i-a-Si:H layer 4 are determined to be 50 W, 250° C., and 1 torr respectively. These parameters are determined to be 40 W, 250° C., and 0.5 torr respectively for deposition of the i-a-$Si_{1-x}$:$Ge_{-x}$:H layer 5. The gases used for growth are $SiH_4$ (25% in $H_{-2}$) and $SiH_4$ (25% in $H_{-2}$)+$GeH_{-4}$ (47.8% in $H_{-2}$). The thickness of each layer was estimated and controlled by a growth rate at 60 Å/min. for the i-a-Si:H layer and at 160 Å/min. for the i-a-$Si_{1-x}$:$Ge_{-x}$:H layer under above described conditions.

The i-a-$Si_{1-x}$:$Ge_{-x}$:H 5 material is used as the absorption-layer because of its low characteristic bandgap, its ability to absorb an incident light and its ability to generate a photoelectric current. To the contrary, the i-a-Si:H material 3 is used as the avalanche layer due to its high bandgap property creating avalanche breakdown, increasing the photoelectric current as well as increasing the optical gain. Furthermore, the atomic ratio X of the i-a-$Si_{1-x}$:$Ge_{-x}$:H material can be changed to adjust its energy level to absorb different wavelength lights so as to enlarge its useful extent.

Figure 2:
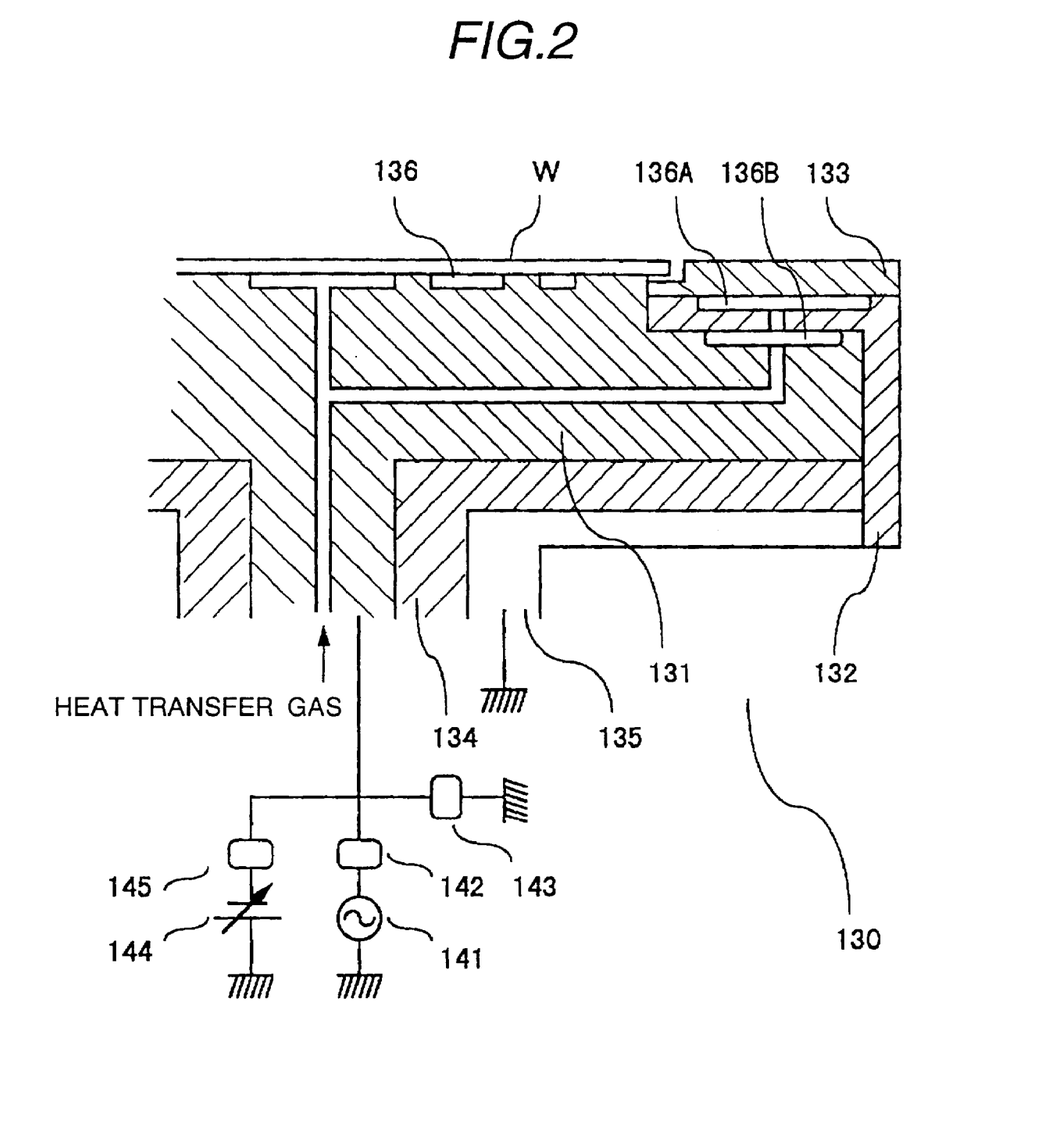
FIG. 2 shows energy band diagrams and electric field profiles of the hole-injection SAMAPD in accordance with the invention in which the conduction band offset ΔEc is 0.2 eV, and the valance band offset ΔEv is 0.1 eV wherein numerals 1–7 having the following designations: 1-Al; 2-p+ type a-Si:H; 3-i-a-Si:H; 4-n+ type a-Si:H; 5-i-a-$Si_{1-x}$:$Ge_{-x}$:H; 6-ITO and 7-glass.

Referring to FIG. 2, the operation mechanism of the hole-injection type SAMAPD is illustrated. At first, a negative voltage sets at the Al 1 end and the ITO 6 end contact earth. In accordance with the Possion equation, a majority of a applied bias will drop across the undoped i-a-Si:H layer 3 and a minority of the applied bias will drop across the i-a-$Si_{1-x}$:$Ge_{-x}$:H layer 5. Electron-hole pairs were generated as the incident light entering from the glass plate into the low-field undoped i-a-$Si_{1-x}$:$Ge_{-x}$:H layer 5 (i.e., the absorption layer) and were separated by an electric field in this layer. The electron-hole pairs generated in the absorption layer were injected into the high field avalanche layer to generate more electron-hole pairs by an avalanche multiplication process. The generated holes will transfer to the p+-type i-a-Si:H layer 2 and the generated electron will transfer to the n+-type i-a-Si:H layer 4 and thus constitutes the total multiplied current. Due to the holes injection from the absorption layer to the avalanche layer, this operation mechanism is named as "the hole-injection type separate absorption and multiplication avalanche photodiode (SAMAPD)" in accordance with the invention.

Figure 3:
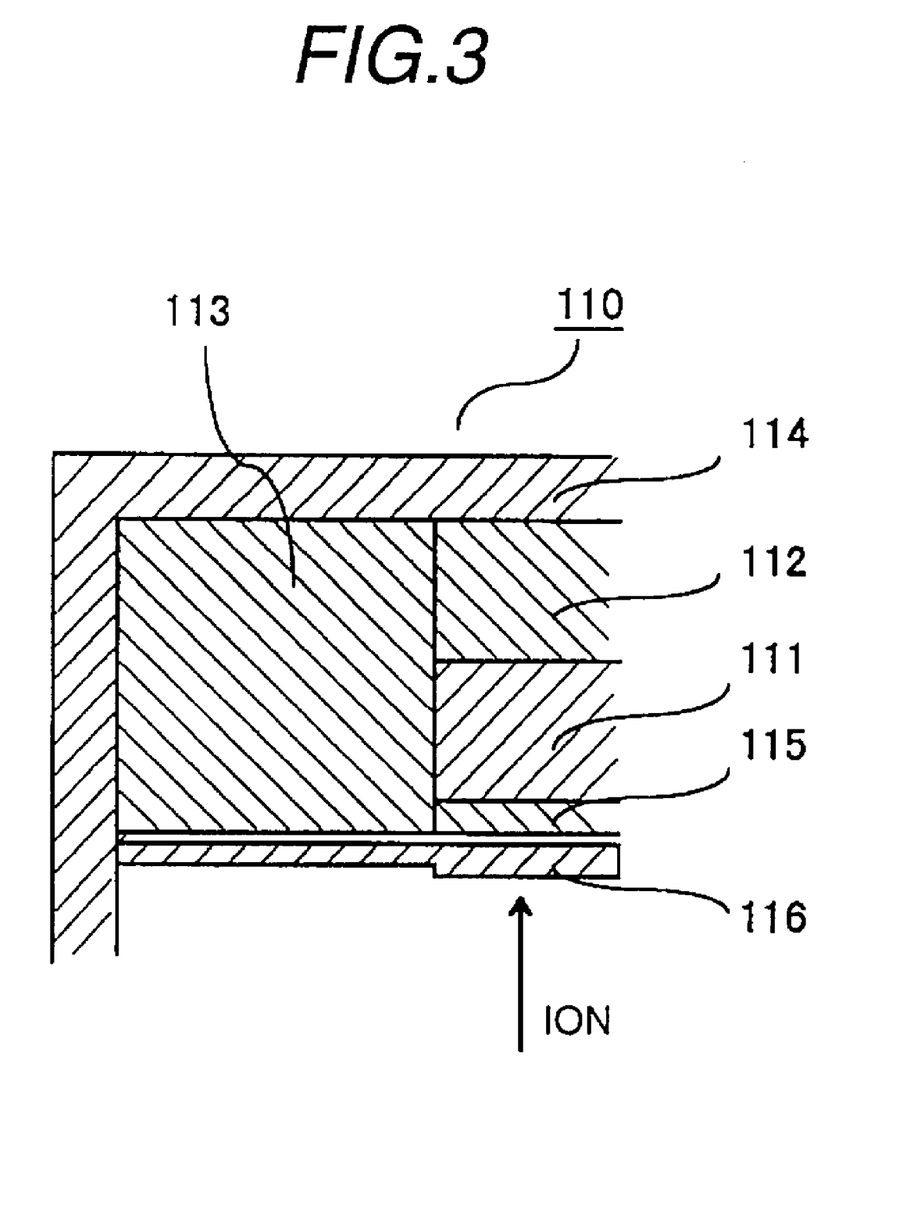
FIG. 3 shows the dark and photo I/V characteristic curves of (a) the hole-injection SAMAPD; (b) conventional PIN APD at various incident light power levels (the traces sequentially from bottom to top correspond to 100 μW, 50 μW, 20 μW, 10 μW, 5 μW, 0 μW)
Figure 4:
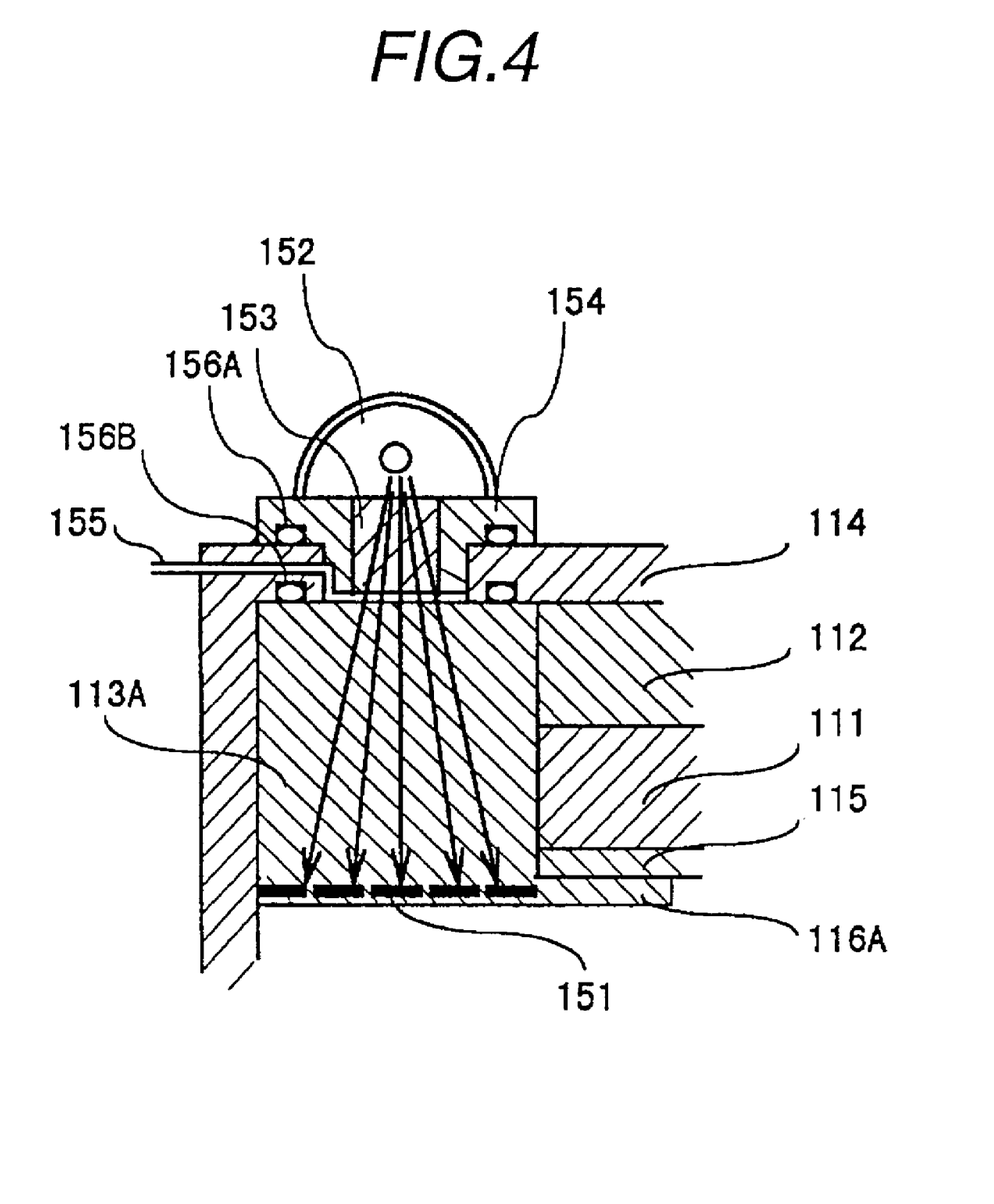
FIG. 4 illustrates the relations between the optical gain and the incident light power of the (1) hole-injection SAMAPD and (2) conventional PIN APD.

The following application examples are described to further illustrate this invention. As described earlier, the hole-injection type SAMAPD is formed in accordance with the schematic diagram shown in FIG. 1. In one example, the atomic ratio, X, in the i-a-$Si_{1-x}$:$Ge_{-x}$:H layer 5 may be set as 0.3. The thickness of the i-a-$Si_{1-x}$:$Ge_{-x}$:H layer 5 is controlled at 7000 Å by monitoring the deposition rate and the thickness of the i-a-Si:H layer 3 is controlled at 420 Å. Due to the use of the incident light in this invention, an obvious photocurrent was measured as shown in FIG. 3(a). For performance comparisons, the conventional PIN APD experiment is also proceeded as shown in FIG. 3(b). The results showed a significant difference between these two photodiodes. With the incident light power Pin at 1 $\mu$W and the dark current at 25 $\mu$A, the values of optical gain of the conventional PIN APD and the hole-injection type SAMAPD are significantly different as shown in FIG. 4. Apparently, the optical gain of the hole-injection type SAMAPD can reach 686 which is much larger than that of the PIN APD. The hole-injection type SAMAPD provided by the invention is therefore very suitable to be used in a long distance optical electric communication.

Figure 5:
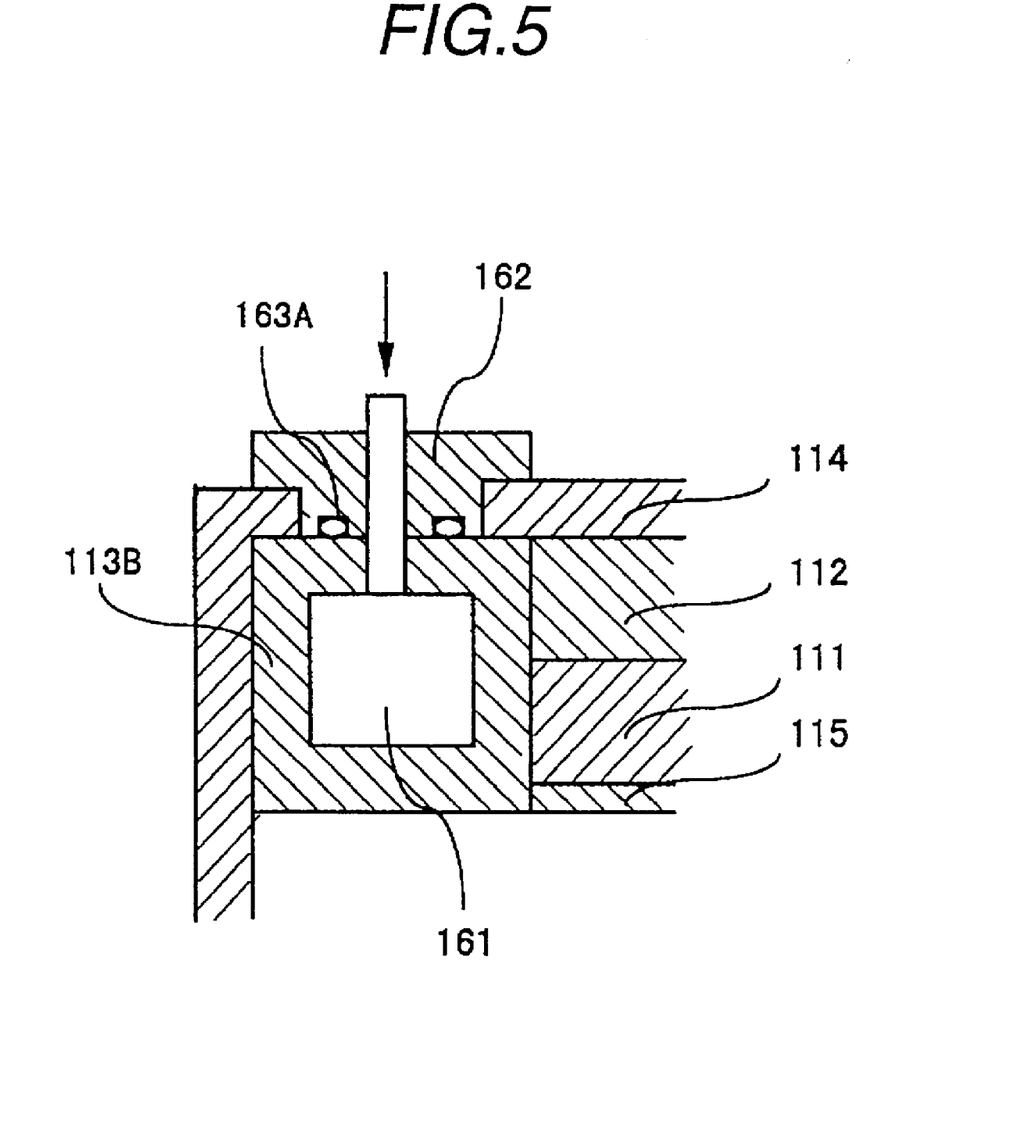
FIG. 5 illustrates the optical gain of the hole-injection SAMAPD measured under different reverse bias.
Figure 6:
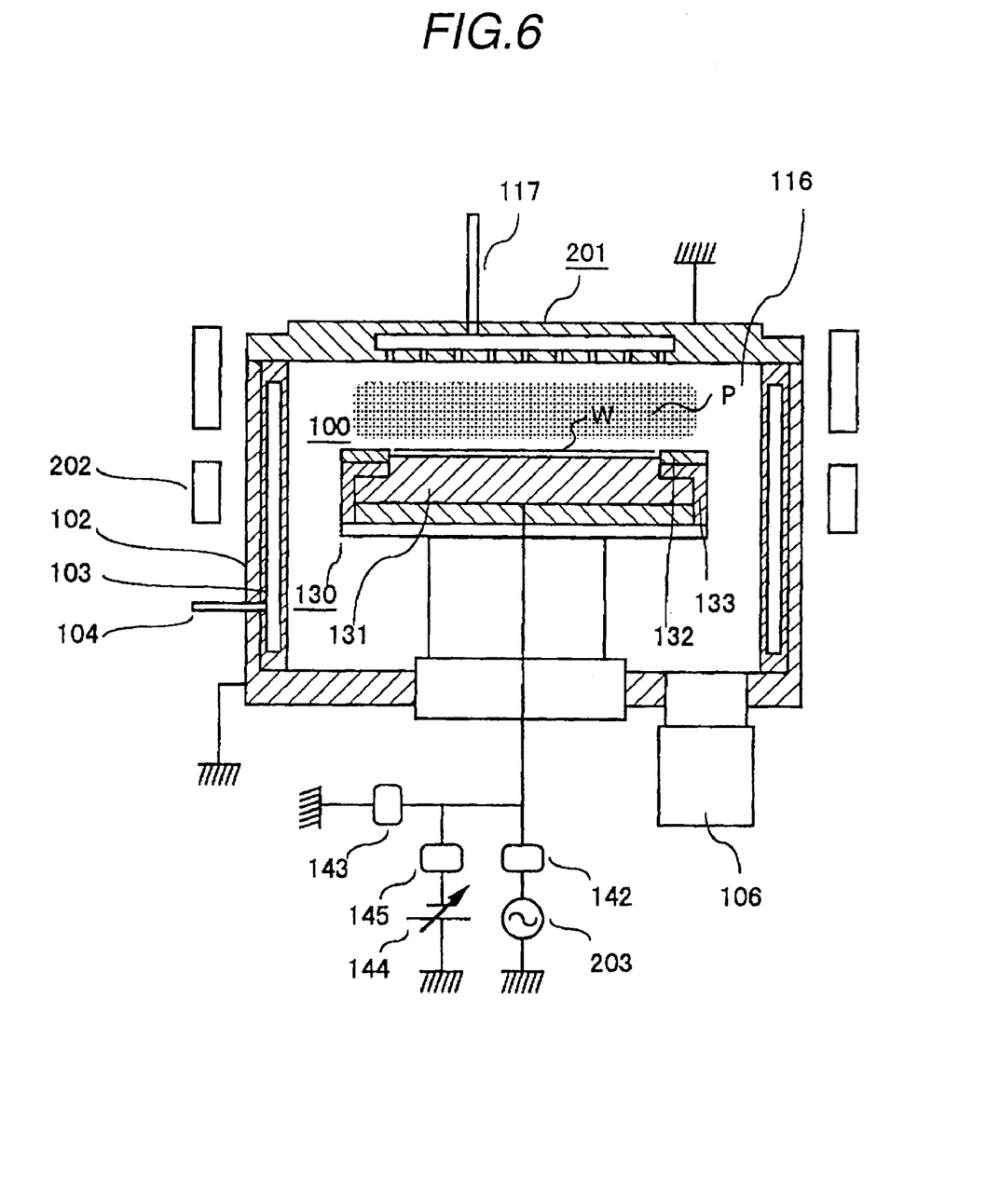
FIG. 6 shows the dark current of the hole-injection SAMAPD measured under different reverse bias.
Figure 7:
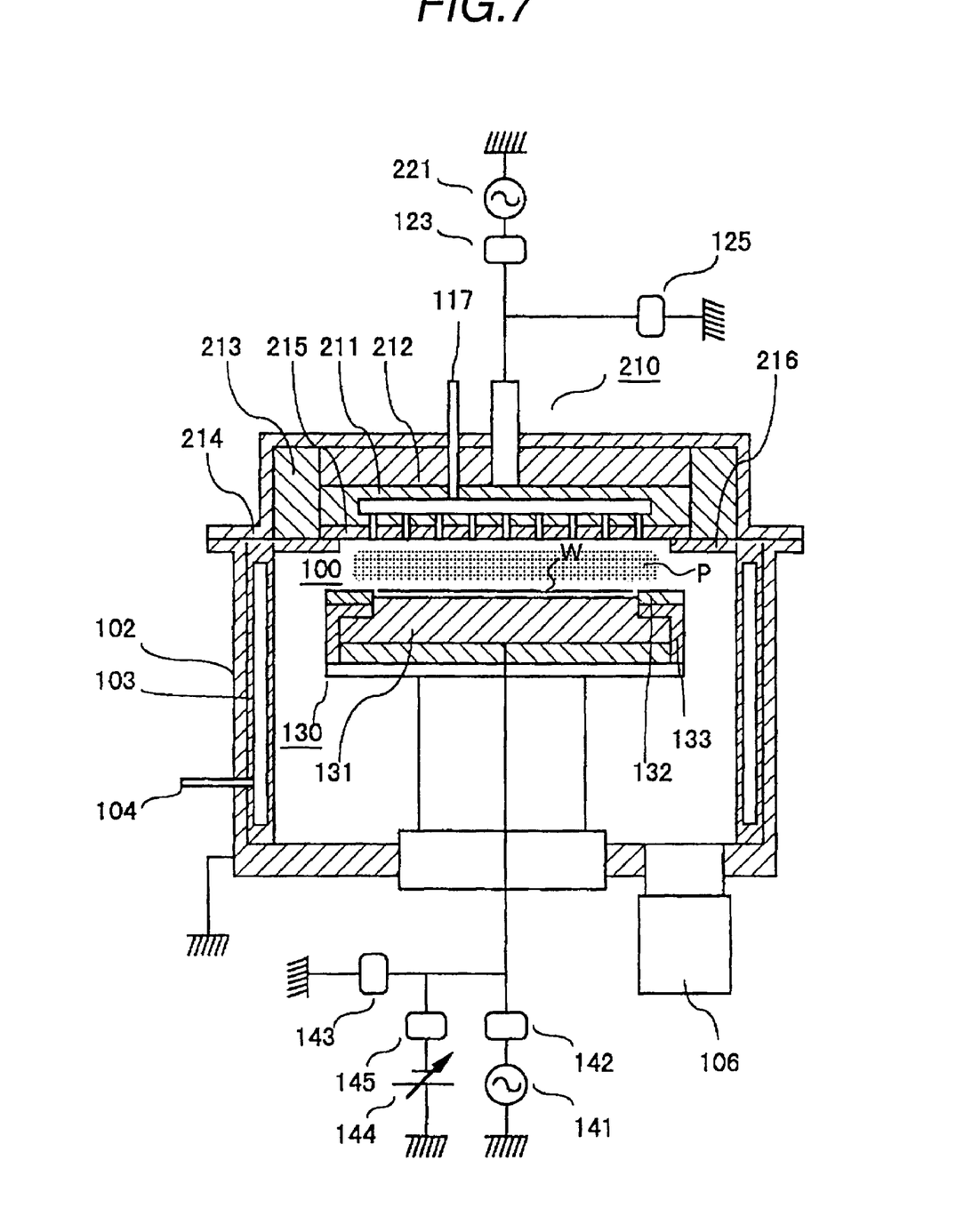
FIG. 7 illustrates the spectrum response of the hole-injection SAMAPD with a 7000 Å undoped a-$Si_{1-x}$:$Ge_x$:H absorption layer.

FIG. 5 shows the effect of a reverse bias on the optical gain of the hole-injection type SAMAPD. The optical gain increases concurrently with an increase in the reverse bias due to high impact ionization rates on photogenerated carriers in the avalanche layer. In addition, as shown in FIG. 7, the higher impact ionization rates may increase the dark current of the hole-injection type SAMAPD which may result in reduction of the accuracy of the photodiode. The experiments showed that, under a reverse bias of 16V, the optical gain of the hole-injection SAMAPD can be as high as 686 at an incident light power of Pin=1 $\mu$W. The dark current under this condition is only 25$\mu$A. The results showed that the SAMAPD so prepared has a low dark current and high optical gain as so required for a hole-injection SAMAPD.

Figure 8:
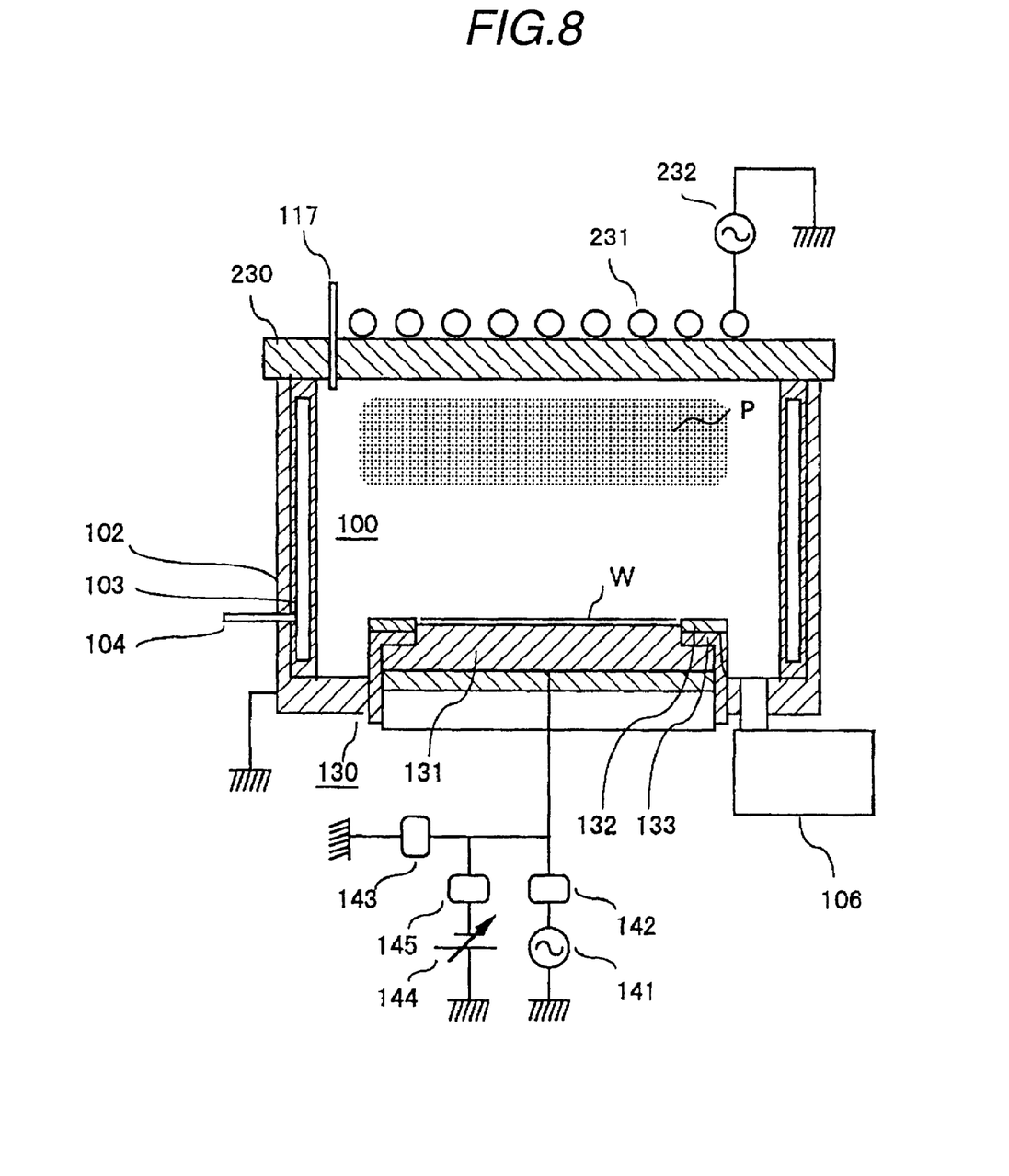
FIG. 8 shows the photoresponse speed of the hole-injection SAMAPD under 14V reverse bias and illumination of an infrared LED (λ=820 nm) with intensity of 100 μW.

As described above, the bandgap can be easily adjusted by changing the X value in the i-a-$Si_{1-x}$:$Ge_x$:H layer to absorb different wavelength lights. As the experimental results shown, for the 7000 Å undoped i-a-$Si_{1-x}$:$Ge_x$:H layer, its peak may shift from 525 nm to 820 nm as the atomic ratio X of Ge increases from 0 to 0.48. FIG. 7 shows a typical photoresponse of the i-a-$Si_{1-x}$:$Ge_x$:H layer in which the X is 0.3. The peak response wavelength of the diode is at 700 nm, i.e. red light. In the meantime, the result of a photoresponse speed study is shown in FIG. 8. The measured rise time of the diode is about 145.3 $\mu$s at 14V reverse bias, which is far more smaller than the fall time (about 385.5 $\mu$s) of the same diode.

In summary, the main purpose of the invention is to provide for an amorphous silicon material which is used to form the avalanche photodiode for replacing the conventional APD. Accordingly, the hoe-injection type SAMAPD was made by separating the absorption layer and avalanche layer from the conventional APD to achieve a photodiode having a reduced dark current and an increased optical gain. Furthermore, the photodiode in accordance with the invention can be prepared with a simple process and very low cost. Since the avalanche layer is made by the high bandgap i-a-Si:H, most of the electric field will drop across this layer to increase the avalanche breakdown and raise the optical gain. On the other hand, the absorption layer is made by the low bandgap i-a-$Si_{1-x}$:$Ge_x$:H layer which permits only a little of the electric field to drop across this layer to effectively decrease the dark current. As a result, any detection error which may happen by a thermal turbulence can be avoided so as to increase the accuracy and sensitivity of the photodiode. More particularly, the atomic ratio, X, in the i-a-$Si_{1-x}$:$Ge_x$:H layer can be changed easily to adjust the energy level to absorb a different variety of wavelength lights. In view of the foregoing, the hole-injection type SAMAPD provided by the invention therefore owns multiple utilities especially applicable to fields of long wavelength optical communication.

What is claimed is:

1. A hole-injection type separate absorption and multiplication avalanche photodiode having a reduced dark current and an increased optical gain as compared to a conventional avalanche photodiode, comprising:

a substrate;

an absorption layer wherein said absorption layer is deposited on a top surface of said substrate and is made with an I-a-Si$_1$-x:Gex:H material having a thickness of 7000 to 11000 Å to achieve the reduced dark current;

an avalanche layer wherein said avalanche layer is located on a upper surface of said absorption layer and is formed by an I-a-Si:H material for said hole injection to raise the optical gain; and an Al layer located on a upper surface of the avalanche layer to serve as a contact electrode.

2. An hole-injection type separate absorption and multiplication avalanche photodiode as claimed in claim 1 wherein said substrate further comprises a glass surface precoated with a transparent conducting oxide layer under thermal evaporation.

3. An hole-injection type separate absorption and multiplication avalanche photodiode as claimed in claim 1 which further comprises a first n+ type a-Si:H layer deposited between said substrate and said i-a-Si1–x:Gex:H material.

4. An hole-injection type separate absorption and multiplication avalanche photodiode as claimed in claim 3 which further comprises a second n+ type a-Si:H layer deposited between said i-a-Si1–x:Gex:H material and said i-a-Si:H material.

5. An hole-injection type separate absorption and multiplication avalanche photodiode as claimed in claim 1 which further comprises a p+ type a-Si:H layer deposited between said i-a-Si:H material and said Al layer.

6. An hole-injection type separate absorption and multiplication avalanche photodiode as claimed in claim 2 wherein said transparent conducting oxide is an Indium-Tin-Oxide.

7. An hole-injection type separate absorption and multiplication avalanche photodiode as claimed in claim 1 wherein said i-a-Si1–x:Gex:H material having a X value ranging from 0 to 0.48 representing an atom percentage of said Ge content.

8. An hole-injection type separate absorption and multiplication avalanche photodiode as claimed in claim 7 wherein said i-a-Si1–x:Gex:H material is able to absorb wavelengths ranging from 525 nm to 820 nm.

* * * * *